United States Patent
Volant et al.

(10) Patent No.: US 6,613,641 B1
(45) Date of Patent: Sep. 2, 2003

(54) PRODUCTION OF METAL INSULATOR METAL (MIM) STRUCTURES USING ANODIZING PROCESS

(75) Inventors: Richard P. Volant, New Fairfield, CT (US); John M. Cotte, New Fairfield, CT (US); Kevin S. Petrarca, Newburgh, NY (US); Kenneth J. Stein, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/764,834

(22) Filed: Jan. 17, 2001

(51) Int. Cl.[7] .......................................... H01L 21/8238
(52) U.S. Cl. .................. 438/396; 438/466; 438/768; 438/957
(58) Field of Search ................. 438/396, 466, 438/768, 957, FOR 220, FOR 430

(56) References Cited

U.S. PATENT DOCUMENTS

| | | | |
|---|---|---|---|
| 4,344,223 A | | 8/1982 | Bulger et al. |
| 4,450,048 A | * | 5/1984 | Gaulier |
| 5,053,917 A | | 10/1991 | Miyasaka et al. |
| 5,068,199 A | * | 11/1991 | Sandhu |
| 5,111,355 A | | 5/1992 | Anand et al. |
| 5,138,411 A | | 8/1992 | Sandhu |
| 5,444,006 A | | 8/1995 | Han et al. |
| 5,516,721 A | * | 5/1996 | Galli et al. |
| 5,625,233 A | * | 4/1997 | Cabral, Jr. et al. |
| 5,926,717 A | * | 7/1999 | Michael et al. |
| 5,960,294 A | * | 9/1999 | Zahurail et al. |
| 6,015,754 A | * | 1/2000 | Mase et al. |
| 6,051,885 A | * | 4/2000 | Yoshida |
| 6,096,632 A | * | 8/2000 | Drynan |
| 6,261,895 B1 | * | 7/2001 | Adkisson et al. |
| 6,294,473 B1 | * | 9/2001 | Oliver |
| 6,323,078 B1 | * | 11/2001 | Bhowmik et al. |
| 6,358,837 B1 | * | 3/2002 | Miller et al. |

OTHER PUBLICATIONS

Appl. No. 09/567,466, filed May 9, 2000, entitled "Encapsulated metal structures for semiconductor devices and MIM capacitors including the same".

* cited by examiner

Primary Examiner—George Fourson
Assistant Examiner—Joannie Adelle Garcia
(74) Attorney, Agent, or Firm—Whitham, Curtis & Christofferson, P.C.

(57) ABSTRACT

Metal-insulator-metal capacitor structures are formed in semiconductor substrates using an anodization procedure on deposited underlying metalization followed by deposition of the second metal and planarization by chemical-mechanical polishing or other procedures. The process is additive in character, as opposed to traditional subtractive etch processes for forming capacitor structures. In addition, the process can be used in damascene applications, and can be used to form a wide variety of capacitive structures while reducing the number of mask layers required for formation.

8 Claims, 2 Drawing Sheets

PRODUCTION OF METAL INSULATOR METAL (MIM) STRUCTURES USING ANODIZING PROCESS

BACKGROUND OF THE INVENTION

Field of the Invention

The present invention generally relates to computer chip manufacture, and more particularly to processing techniques for manufacturing MIM structures on semiconductor substrates.

Background Description

Capacitors are comprised of two metal plates separated by an insulator material. These devices are used extensively in circuitry formed in semiconductor substrates. The typical process for formation of capacitors is by deposition of a metal layer, deposition of an insulator layer, deposition of a second metal layer, and finally etching the three layer structure to create capacitors at desired locations. This requires extensive use of lithographic masking, does not flow well with complementary metal oxide semiconductor (CMOS) processing, and may not be practicable in some damascene applications.

SUMMARY OF THE INVENTION

It is an object of this invention to provide a low cost and efficient process for manufacturing metal insulator metal capacitor (MIM cap) structures in semiconductor substrates.

According to the invention, a first metal layer is deposited within a cavity in a substrate. The substrate may be silicon, gallium arsenide or some other material, but also may be a silicon dioxide layer, or an alternative insulative layer of a semiconductor device (such as would be the case in damascene processing). Regardless of the nature of the substrate, for purposes of this invention the substrate will be deemed any material used in semiconductor fabrication. After depositing the first metal layer, the top surface is oxidized to form a metal oxide over coat layer. Oxidation can be best achieved by anodizing. Once the metal oxide over coat layer is formed, additional insulative layers may be added such as silicon nitrides and silicon oxides (e.g., silicon dioxide), or a second metal layer can be deposited directly on top of the metal oxide over coat layer. Preferably, the first and second metal layers are the same; however, they could be different to meet the requirements of the component being manufactured. A significant number of variations on these processes can be employed.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1:
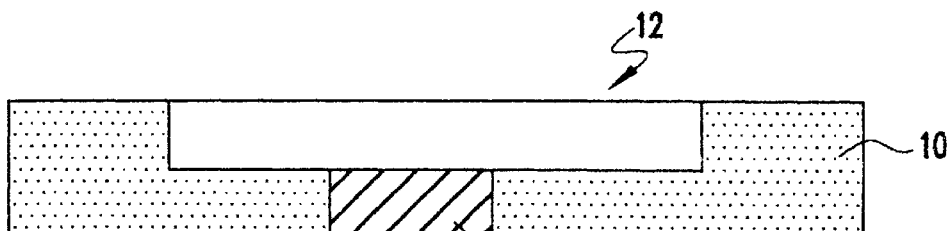
FIG. 1 is a cross-sectional side view of a patterned substrate having a cavity in a top surface.

FIG. 1 shows substrate 10 with a cavity 12 formed in its top surface. The substrate 10 can be any material used in semiconductor fabrication including without limitation silicon, silicon dioxide, gallium arsenide, etc. In the embodiment shown in FIG. 1, a metal plug 14 is positioned at the bottom of the cavity 12; however, it should be understood that other contact configurations can be used within the practice of this invention. Of course, the entire structure shown in FIG. 1 can sit atop another semiconductor substrate (not shown). The structure shown in FIG. 1 can be viewed as a typical Damascene CMOS back end of line (BEOL) substrate. Only a single lithographic mask is required to form the cavity 12 (recess) in the substrate.

Figure 2:
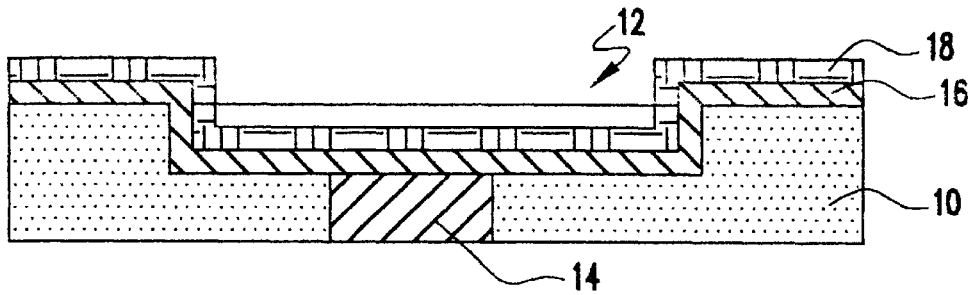
FIG. 2 is a cross-sectional side view of the patterned substrate of FIG. 1 having both a first metal lower layer (e.g., TaN), and an oxide layer (e.g., TaO$_5$ created by anodizing the TaN)

FIG. 2 shows the substrate 10 after a first metal layer 16 has been deposited therein, and after a metal oxide layer 18 has been formed on top of the first metal layer 16. Deposition can proceed by chemical vapor deposition (CVD) techniques or other processes where the first metal layer conforms to the surface of the substrate 10, and extends down into the cavity 12, up the cavity side walls, and across the top surface of the substrate 10. The metal oxide layer 18 is formed from the first metal layer 16. Thus, it is more compatible with the first metal layer 16, and is more likely to stick to and not separate from the first metal layer during subsequent processing conditions. A suitable process for forming the metal oxide layer 18 is by anodizing.

As explained in "Thin Film technology", by Berry et al. Van Nostrand Reinhold Co., 1968, anodization is the formation of a metal oxide coating by the electrochemical oxidation of a metal anode in an electrolyte. Anodizable metals are often referred to as "valve metals" due to the rectifying characteristics of their anodic oxides. During anodization, the metal anode is oxidized and metal cations formed react directly with oxygen of hydroxyl ions in the electrolyte to form a continuous amorphous film. The electrolytic cell which can be used to anodize a work piece comprises electrolyte, valve metal anode, an inert cathode, and a power source. Wafer scale anodization can be performed using tools conventionally used for wet processing such as those used for electroplating. The anode and cathode can be submerged in the electrolyte with electrical contact being made to both electrodes.

Figure 3:
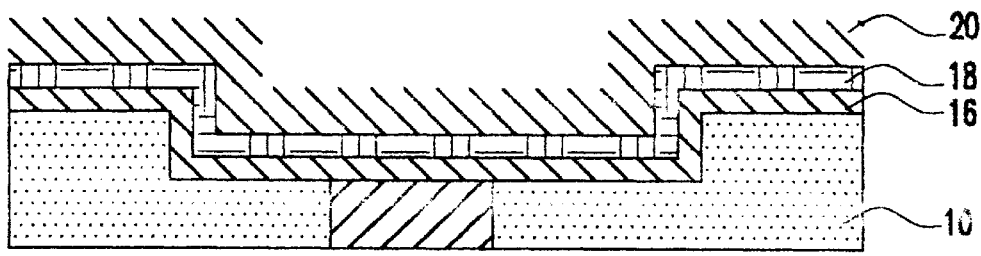
FIG. 3 is a cross-sectional side view of the patterned substrate of FIG. 2 having a second metal layer deposited on the oxide layer.

FIG. 3 shows the substrate 10 after a second metal layer 20 is overlayed over the metal oxide layer 18. Preferably, the second metal layer 20 will be the same as the first metal layer 16, thus, this second metal layer 20 will also have the advantages of compatibility and enhanced ability to stick to the metal oxide layer 18. However, there may will be many applications where the first and second metal layers are different from one another. In addition, for some fabrications, it may be advantageous to deposit an additional insulative layer (not shown) on top of the metal oxide layer prior to deposition of the second metal layer 20. For example, silicon dioxide and silicon nitride might be deposited.

Figure 4:
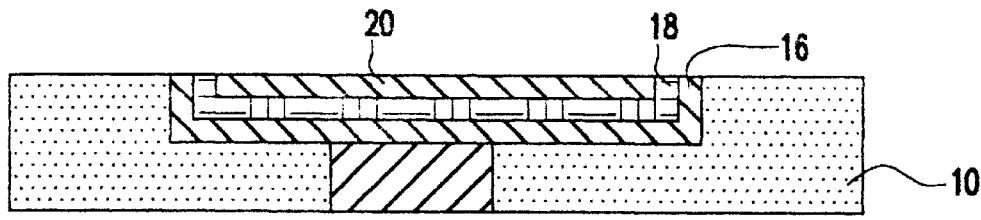
FIG. 4 is a cross-sectional side view of the patterned substrate of FIG. 3 after polishing the top trilayer structure from the substrate.

FIG. 4 shows the substrate 10 after the trilayer structure on its top surface has been removed by, for example, chemical mechanical polishing. Other techniques might also be used to planarize the substrate 10 as shown in FIG. 4. The end result is a MIM cap structure with two metal plates separated by an insulator preferably formed by anodizing the first metal layer.

Table 1 lists some representative metals which could be used as the first and second metal layers within the practice of this invention, and the corresponding oxide which would be created by anodizing.

| Metal | Anodic oxide |
|---|---|
| Al | $Al_2O_3$ |
| Sb | $Sb_2O_3$ or $Sb_2O_4$ |
| Bi | $Bi_2O_3$ |
| Hf | $HfO_2$ |
| Nb | $Nb_2O_5$ |
| Ta | $Ta_2O_5$ |
| Ti | $TiO_2$ |
| W | $WO_3$ |
| Y | $Y_2O_3$ |
| Zr | $ZrO_3$ |

The metal in the first and second metal layers is preferably the same. The metal can be deposited in pure form, as meta alloy combinations (e.g., TiAl), in the form of a nitride (e.g., TaN), or in other forms. The guiding principle is that an anodized materials more likely to adhere well to the "parent" material that was present prior to the anodizing (e.g., $Ta_2O_5$ is more likely to adhere well to $TaN_x$ or Ta than to another metal such as copper (Cu)). It is also easier to fabricate since fewer layers are needed.

In general, the formula for capacitor value is $C=8.85\times10^{-12}(kA/S)$ where C is the value of the capacitor in Farads, k is the dielectric constant of the insulator between the plates, A is the common area of plates in $M^2$, and S is the spacing between pates in M. The capacitors of this invention can be of almost any size, and may preferably be around $5\times5\ \mu m$'s. The maximum size will depend on planarization capabilities (e.g., CMP). It is possible to use CMP to planarize metals having a plate area of several millimeters squared, therefore, the area of the plates in this invention can be several millimeters squared. The dielectric thickness may typically be around 500 Å. Generally, the dielectric insulative layer should range from 50 Å to 1000 Å.

For exemplary purposes only, the process illustrated in FIGS. 1–4 can be pursued as follows. Starting with a typical Damascene CMOS BEOL, a single lithographic mask is used to form a recess in the dielectric, and this can be done in conjunction with a metal line level. The recess for the MIM is approximately 2000 Å deep. TaN can then be deposited over the substrate and in the recess at a thickness of 1000 Å. About 250 Å to 300 Å is then anodized to form $TaO_5$. Then, another layer of TaN is deposited at a thickness of about 800 Å. The surface is polished using CMP. What remains in the recess is a bottom plate of TaN contacted by an underlying via or stud. In addition, there is a thin dielectric layer of $TaO_5$ with a thin final layer of TaN forming the top plate. In addition to the $TaO_5$, multiplayer of insulator can be deposited such as $SiN_x$ and silicon dioxide, and the thicknesses of these layers may preferably range between 50 Å and 100 Å depending on the requirements for the device. This would necessitate the polishing to be done in two steps rather than one, thereby hermetically sealing the lower plate of the cap.

Figure 5:
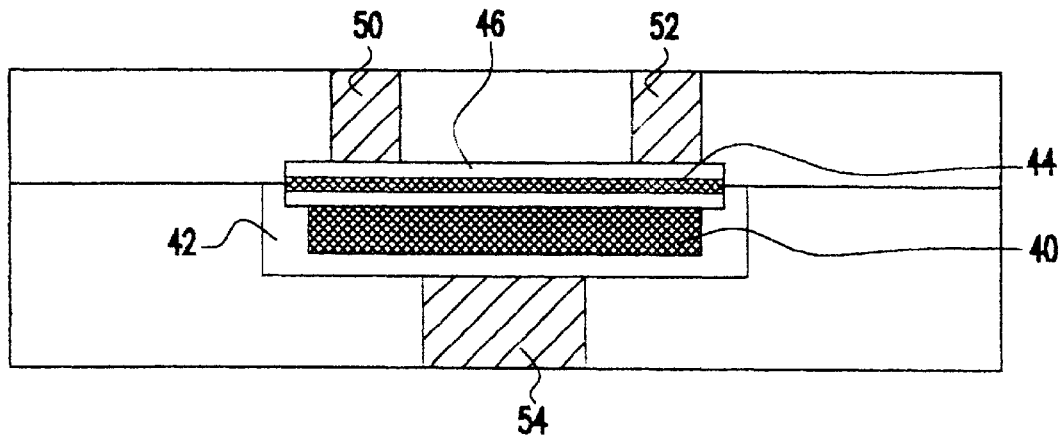
FIG. 5 is a cross-sectional side view of one example of a MIM structure according to this invention.
Figure 6:
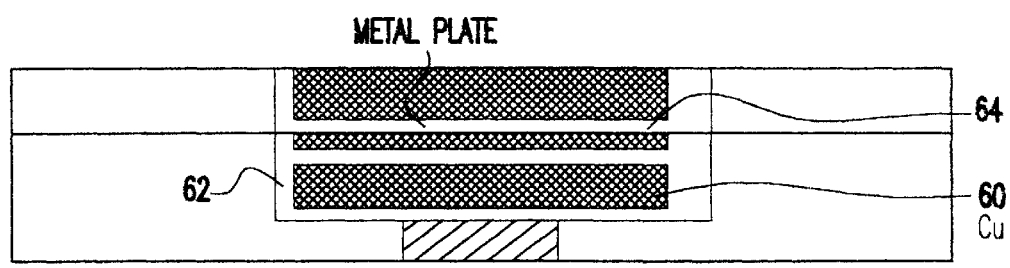
FIG. 6 is a cross-sectional side view of another example of a MIM structure according to this invention.
Figure 7:
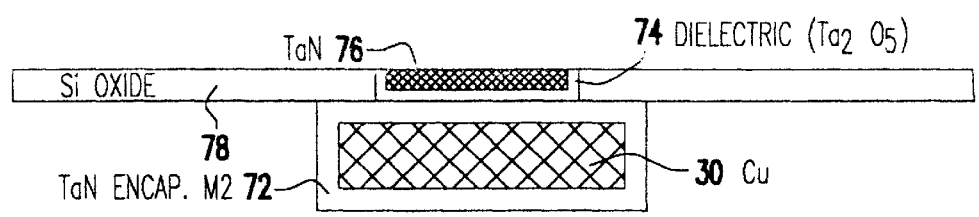
FIG. 7 is a cross-sectional side view of yet another example of a MIM structure according to this invention, wherein the metal oxide is positioned within an encapsulating silicon dioxide layer.
Figure 8:
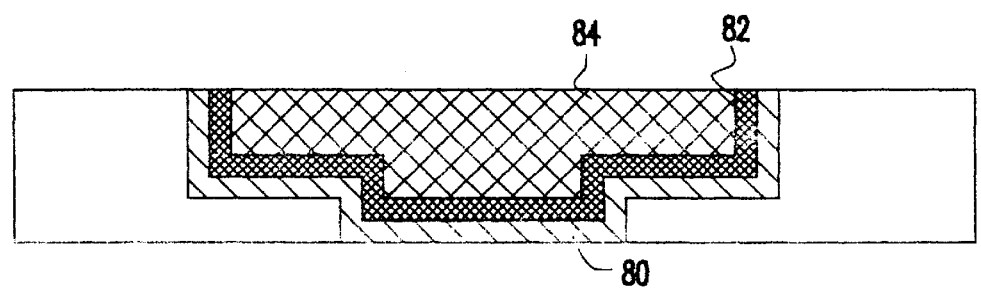
FIGS. 8–10 shows cross-sectional side views of dual damascene structures where the via level is used to form the top plate.
Figure 9:
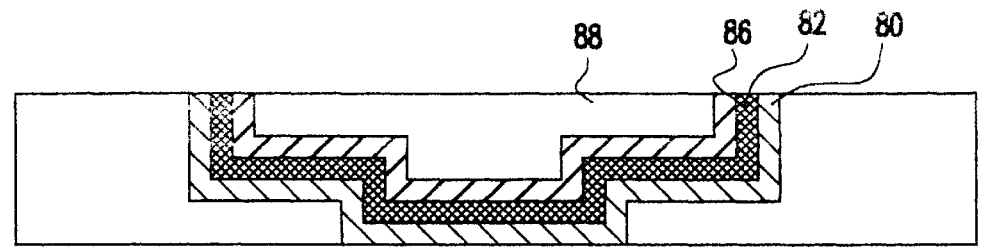
Figure 10:
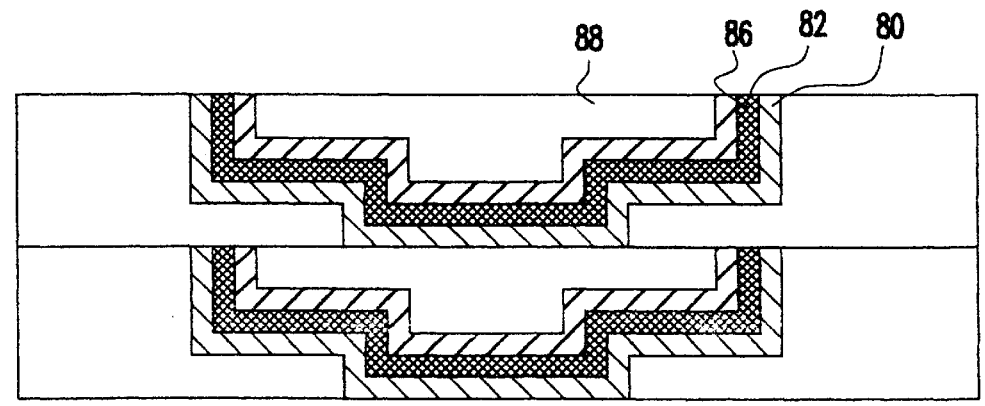

The invention can be practiced in conjunction with many different device forms. For example, FIG. 5 shows an encapsulated copper plate, where copper 40 is overcoated with a metal layer, such as Ta or any of the other materials discussed above, to form a layer 42. A dielectric layer 44 is created by anodization, and a second metal layer forms plate 46 (made by subtractive etching or other mechanisms). Metal vias 50, 52, and 54 contact the two plates. As another example, FIG. 6 shows a stacked single Damascene, where copper 60 is encapsulated in a metal layer 62, such as Ta or any other materials discussed above, and a dielectric 64 is formed by anodization. As still another example, FIG. 7 shows copper 30 encapsulated in a metal layer 72, such as Ta or any of the other materials discussed above. There is an anodized metal layer 74, such as a tantalum oxide, with a top metal plate 76 of, for example tantalum. The tantalum oxide 74 can be created by anodizing the sidewall of the Ta plate 76. The top plate 76 is positioned within an insulative surround 78 such as silicon dioxide. FIGS. 8–10 show dial Damascene devices. In FIG. 8, the bottom plate 80, can be created by conformal deposition of TaN. Subsequent anodization forms dielectric 82, and a metal top plate 84 is deposited within the space defined by the dielectric 82. The metal top plate 84 can be any metal, such as Ta, or any of the metals noted above. FIG. 9 shows a variation where a metal liner 86 is added on top of the dielectric 82, and the remainder is filled with a different metal 88 (for example, FIG. 9 may represent a via with a Ta, tantalum dioxide, Ta layup with a copper inlay). FIG. 10 shows a stacked dual Damascene configuration where the via level is used to form the top plate.

While the invention has been described in terms of its preferred embodiments, those skilled in the art will recognize that the invention can be practiced with modification within the spirit and scope of the appended claims.

We claim:

1. A method for forming capacitor structures in a substrate, comprising the steps of;
   depositing a first layer over a top ice and within a cavity on said top surface of a the substrate;
   forming by anodization a metal oxide layer on top of said first layer using metal from said first layer to form said metal oxide layer; and
   depositing a second layer over said metal oxide layer,
   said two depositing steps and said forming step creating a trilayer structure which extends above said cavity; and
   removing said trilayer structure form above said top surface of said substrate,
   wherein said first layer and said second layer are made of materials selected from the group consisting of metals and electrically conductive metal nitrides.

2. The method of claim 1 wherein said removing step is performed by chemical mechanical polishing.

3. The method of claim 1 wherein said first and second layers are identical.

4. The method of claim 1 wherein said first and second layers are selected from the group consisting of Al, Sb, Bi, Hf, Nb, Ta, Ti, W, Y, and Zr, alloys of the same metals, and said first and second layers comprise the same or different metals.

5. The method of claim 4 wherein said first and second layers are present in the form of a metal nitride.

6. The method of claim 1 wherein said forming step is performed so as to form a metal oxide layer having a thickness ranging from 50 Å to 1000 Å.

7. The method of claim 1 further comprising the step of adding an insulative layer on said metal oxide layer.

8. The method of claim 4 wherein said first and second layers are present in the form of a metal alloy.

* * * * *